(12) United States Patent
Bringivijayaraghavan

(10) Patent No.: US 6,965,263 B2
(45) Date of Patent: Nov. 15, 2005

(54) BULK NODE BIASING METHOD AND APPARATUS

(75) Inventor: Venkatraghavan Bringivijayaraghavan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/268,313

(22) Filed: Oct. 10, 2002

(65) Prior Publication Data

US 2004/0070441 A1 Apr. 15, 2004

(51) Int. Cl.[7] .................................................. G05F 3/02
(52) U.S. Cl. ........................ 327/537; 327/536; 365/226
(58) Field of Search ................................ 327/536, 537; 363/59, 60; 365/226

(56) References Cited

U.S. PATENT DOCUMENTS

| | | | |
|---|---|---|---|
| 4,847,522 A | * 7/1989 | Fuller et al. ................... 326/58 |
| 5,451,889 A | 9/1995 | Heim et al. |
| 5,594,381 A | * 1/1997 | Bingham ..................... 327/534 |
| 5,602,794 A | * 2/1997 | Javanifard et al. ........... 365/226 |
| 5,672,996 A | * 9/1997 | Pyeon ......................... 327/534 |
| 5,694,072 A | 12/1997 | Hsiao et al. |
| 5,767,733 A | * 6/1998 | Grugett ........................ 327/534 |
| 5,930,175 A | 7/1999 | Lakhani et al. |
| 5,933,378 A | 8/1999 | Gans et al. |
| 5,943,263 A | * 8/1999 | Roohparvar ........... 365/185.18 |
| 5,946,259 A | 8/1999 | Manning et al. |
| 5,978,268 A | * 11/1999 | Zink et al. ............. 365/185.18 |
| 5,999,475 A | * 12/1999 | Futatsuya et al. ........... 365/226 |
| 6,023,427 A | 2/2000 | Lakhani et al. |
| 6,356,499 B1 | * 3/2002 | Banba et al. ................ 365/226 |

OTHER PUBLICATIONS

Khouri et al., "Very Fast Recovery World–line Voltage Regulator for Multilevel Nonovolatile Memories," 4 pages.
Min et al., " A High–Efficiently Back–Bias Generator with Cross–Coupled Hybrid Pumping Circuit for sub–1.5 V DRAM applications," 4 pages, Memory Design Dept. 4, Hyundai Electronics Industries Co., Ltd.
Pelliconi et al., "Power Efficient Charge Pump in Deep Submicron Standard CMOS Technology," 4 pages, STMicroelectronics—Central R&D.
Kim et al., "Two–Phase Boosted Voltage Generator for Low–Voltage Giga–Bit DRAMs," Feb. 2000, pps. 266–269, IEICE Trans. Electron, vol. E83–C, No. 2.
St. Pierre, Robert, "Low–Power BiCMOS Op–Amp with Integrated Current–Mode Charge Pump," Jul. 2000, pps. 1046–1050, IEEE Journal of Solid–State Circuits, vol. 35, No. 7.
Pylarinos et al., "A Low–Voltage CMOS Filter for Hearing Aids using Dynamic Gate Biasing," 6 pages, 2001, CCECE/CCGEI.

* cited by examiner

Primary Examiner—Terry D. Cunningham
(74) Attorney, Agent, or Firm—TraskBritt

(57) ABSTRACT

A biasing circuit with application to a charge pump environment for coupling the appropriate terminal voltage potentials to the bulk node. Specifically, a pass gate, such as a transistor of an integrated circuit, operates to isolate a boosted voltage input from a boosting device such as a charge pump voltage doubler and to transfer or pass the related charge to an output that is coupled to a charge store. The input and output of the pass gate are subjected to variations in voltage levels creating transient voltage potential relationships between the input (e.g., source), the output (e.g., drain), and the pass gate substrate (e.g., bulk node). Such fluctuations are accommodated through continuous monitoring of the input and output terminals and, when appropriate, coupling the corresponding potential as exhibited at one of the input or output terminals to the substrate or bulk node of the pass gate.

21 Claims, 8 Drawing Sheets

BULK NODE BIASING METHOD AND APPARATUS

BACKGROUND OF THE INVENTION

1. Field of the Invention

This invention relates to semiconductor integrated circuits and, more particularly, to integrated circuits utilizing voltage generation.

2. State of the Art

Semiconductor devices such as metal-oxide semiconductor (MOS) devices or transistors are comprised of four terminals: gate, source, drain, and bulk. The connection integrity of these terminals is critical for proper operation and device longevity. For example, in p-channel MOS (PMOS) devices, the source terminal is generally connected to the highest voltage potential of any other terminal of the device, meaning the source is generally more positive in voltage than, for example, the drain terminal. Similarly important is that the bulk terminal of the transistor must be at a potential equivalent to the most positive of either the source or drain terminals in order to mitigate the possibility of the transistor locking up into an inoperable and even destructive state, known by those of skill in the art as the "latch-up" condition.

In a simplified design, the bulk terminal is generally connected directly to the source terminal since the source terminal is generally more positive in voltage potential than the drain terminal. However, there are situations, such as in charge pump applications, where the source terminal of the transistor can assume a lower voltage potential than the drain terminal of the transistor. In such a scenario, a latch-up condition can occur if the bulk terminal is connected to the source terminal of the transistor since the drain terminal would have a higher voltage potential than the bulk terminal. It should be reiterated that the latch-up condition is not just an impairment to the circuit, but rather a latch-up condition can result in destruction of an entire circuit and associated system. Therefore, it would be an advantage to provide a mechanism that minimizes such occurrences.

BRIEF SUMMARY OF THE INVENTION

The above-mentioned problems with circuit latch-up may be mitigated by application of the present invention and will be understood by reading and studying the following specification. The invention evaluates the voltage potentials at the various terminals or nodes of a pass transistor and appropriately biases the bulk node of the transistor to mitigate the occurrence of a latch-up condition due to transient voltage potential fluctuations and switching between higher and lower voltages through a pass transistor.

In particular, the present invention describes a biasing circuit with application to a charge pump environment for coupling the appropriate terminal voltage potentials to the bulk node. Specifically, a pass gate, such as a transistor of an integrated circuit, operates to isolate a boosted voltage input from a boosting device such as a charge pump's voltage doubler and to transfer or pass the related charge to an output that is coupled to a charge store. Therefore, the input and output of the pass gate are subjected to variations in voltage levels creating transient voltage potential relationships between the input (e.g., transistor source terminal), the output (e.g., transistor drain), and the pass gate substrate (e.g., bulk node). Such fluctuations are accommodated in the present invention through continuous monitoring of the input and output terminals and, when appropriate, coupling the corresponding potential as exhibited at one input or output terminal to the substrate or bulk node of the pass gate.

In one specific exemplary embodiment, the biasing circuit includes a first switch having a first switch terminal that is coupled to the pass gate input voltage as generated by the charge pumping device and a second switch terminal which couples to the bulk node of the pass gate. The first switch also includes a control terminal or gate which is coupled to the output voltage of the pass gate. Additionally, the biasing circuit includes a similar second switch arrangement which is coupled in a complementary manner. Specifically, the second switch includes a first switch terminal which also couples to the bulk node of the pass gate and a second switch terminal which couples to the output voltage. Similarly, the second switch also includes a control terminal which couples to the input voltage and, when activated, enables conduction between the first switch terminal and the second switch terminal of the second switch.

Another exemplary embodiment of the present invention incorporates the biasing circuit into a charge pump which properly includes a voltage booster for charge generation and the pass gate for isolating and transferring the generated charge to an output storage and load. Additional embodiments include a multiphase charge pump providing additional charge pumping capability and for providing less ripple on the output.

A method of biasing a bulk node of a pass gate in a charge pump is also encompassed by the present invention. The method comprises the steps of monitoring a first and second voltage at both input and output terminals of the pass gate, selecting one of the first and second voltages having the greater potential, and coupling the one of the first and second voltages that has the greater potential with the bulk node of the pass gate of the charge pump.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

With the increased sensitivity to circuit speed and power consumption, many electronic circuits and even electronic systems have scaled componentry topology as a means of addressing switching speed and power concerns. As a result, circuits, such as integrated circuits, that utilize semiconductor or other similar substrates have been able to minimize circuit dimensions and thereby increase the speed associated with the circuits while also reducing the power and voltage levels utilized by those circuits. Therefore, systems incorporating such varying circuitry topology incorporate a varying suite of circuitry and interface voltages. Such a variety of voltages presents circuitry problems that must be addressed; otherwise, undesirable circuit lock-up or latch-up conditions can occur that not only impede or impair the operation of a circuit but may also result in the circuit's demise.

Those of ordinary skill in the art appreciate that varying voltage signals present within a circuit may be created using a variety of techniques. One such technique that has become commonly accepted is the utilization of a charge pump device for creating differing voltage references for utilization by a circuit to perform operations such as turning transistors on "harder" with an enhanced voltage potential, as well as other applications where enhanced potential advantageously impacts circuit performance and capability.

Circuits used for creating such differing voltages also suffer from the same sensitivity to latch-up as other, broader circuit implementations. To mitigate such an undesirable condition in an integrated circuit, for example, a circuit designer can select certain biasing techniques that present appropriate reference levels at various componentry terminals. The present invention provides an apparatus and method for appropriately biasing the substrate, or more accurately, the bulk node, of transistors, pass gates, and the like that are exposed to transitory voltage levels that may occur during power-up of the circuit or during switching of a charge pump resulting in deleterious effects to the circuit.

Figure 1:
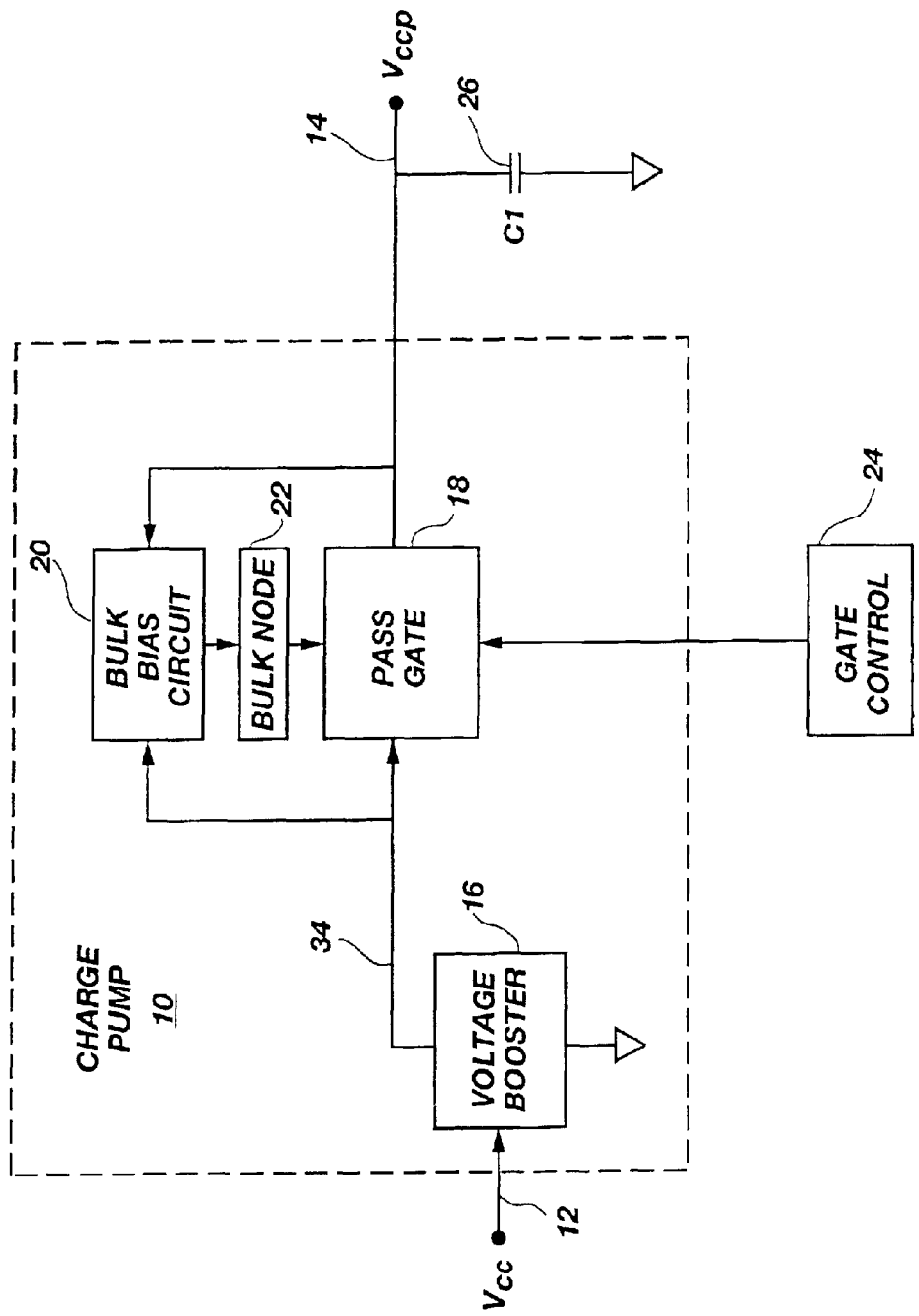
FIG. 1 is a simplified block diagram of a charge pump circuit including a bulk node bias circuit, in accordance with the present invention.

FIG. 1 illustrates a charge pump 10 which incorporates the novel biasing technique of the present invention. As illustrated, charge pump 10 receives a VCC input voltage node 12 and generates a different voltage which may vary in magnitude and/or polarity. In the present example, input voltage node 12 is converted to VCCP output voltage node 14 through the process, for example, of charge pumping. As illustrated, charge pump 10 is comprised of a voltage booster 16, an isolation or pass gate 18 and a bulk bias circuit 20 for protectively biasing the bulk node 22 of pass gate 18.

Figure 2:
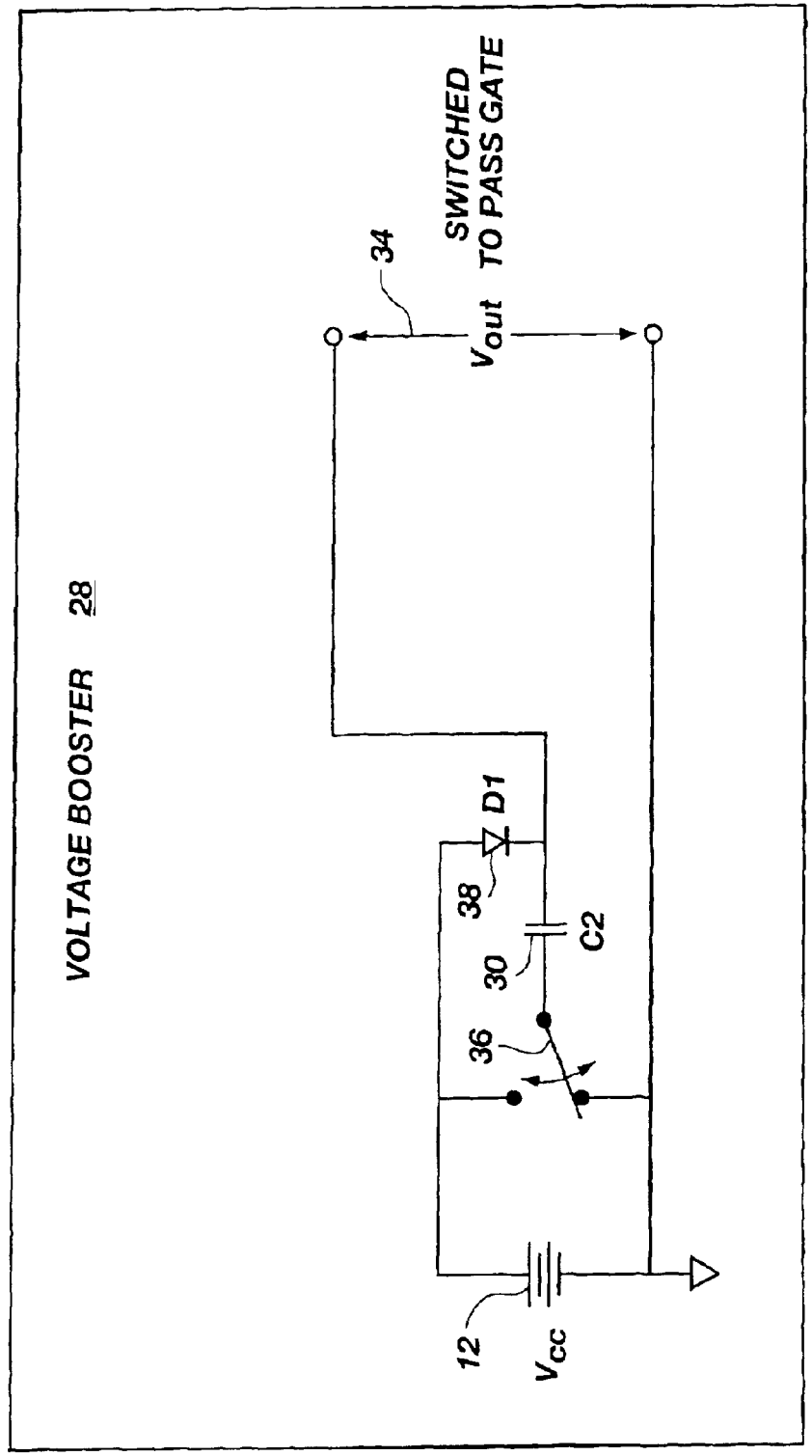
FIG. 2 is an exemplary configuration of a voltage booster utilized in a charge pump, in accordance with an embodiment of the present invention.

From an operational aspect, voltage booster 16 receives input voltage node 12 and steps the voltage up as presented at an output illustrated as boosted voltage output 34. The voltage stepping process occurs, in one embodiment as illustrated in FIG. 2, by charging or storing charge in a storage element, such as a capacitor, in a parallel configuration from input voltage node 12. Once the storage element is charged, the storage element is switched in series with input voltage node 12, or another charged storage element, which then presents a voltage potential greater than input voltage node 12 at boosted voltage output 34.

Pass gate 18 provides an isolation and facilitates the transfer of the charge at boosted voltage output 34 to output voltage node 14. As illustrated, pass gate 18 is also under the control of a gate control signal 24 which coordinates the passing or transition of charge from voltage booster 16 to a charge storage mechanism, illustrated as capacitor 26, coupled to output voltage node 14. Those of ordinary skill in the art appreciate the timing and activation associated with gate control signal 24 as coordinated with the operational aspects of voltage booster 16. It should also be appreciated that the voltage level at boosted voltage output 34 and output voltage node 14 are transient and present biasing problems at pass gate 18 which may result in a latch-up condition if the various terminals do not maintain voltage potentials with respect to each other that mitigate such a condition.

FIG. 2 illustrates one example, from among several, of a charge pumping voltage booster for use in an embodiment of the present invention. In FIG. 2, voltage booster 28 is depicted as a specific embodiment of a more general voltage booster 16 as illustrated within charge pump 10 of FIG. 1. While separate voltage supplies could be used for input voltage VCC as present at input voltage node 12 and output voltage VCCP as present at output voltage node 14 (FIG. 1), the present invention contemplates utilization of a charge pump as a means for generating the differing voltages. Voltage booster 28 is illustrated as a charge pump voltage doubler which operates by charging capacitor 30 from input voltage VCC at input voltage node 12 and then transferring the charge from capacitor 30 to boosted voltage output 34.

Voltage booster 28 operates when switch 36 is first connected to ground, causing the charging of capacitor 30 through diode 38 from the input voltage VCC at input voltage node 12 to a potential of VCC less the conduction threshold voltage, Vt, drop or loss across diode 38. Subsequently, switch 36 toggles into a position coupled to input voltage VCC at input voltage node 12 causing the charge resident within capacitor 30 to be added to the potential presented by VCC at node 12. This summed or cumulative voltage is approximately 2 VCC less Vt from diode 38. A repetitive cycling of switch 36 results in capacitor 26 (FIG. 1) eventually becoming charged to a potential approaching two times the input voltage VCC as seen at input voltage node 12 when the losses associated with boosting and the diodes are overlooked. It should be reiterated that voltage booster 28 as illustrated in FIG. 2 is but one exemplary embodiment of charge transferring contemplated within the present invention. Those of ordinary skill in the art appreciate other charge transferring or charge dumping mechanisms and configurations utilizing charge storing and charge transferring mechanisms which are also contemplated within the scope of the present invention.

Figure 3:
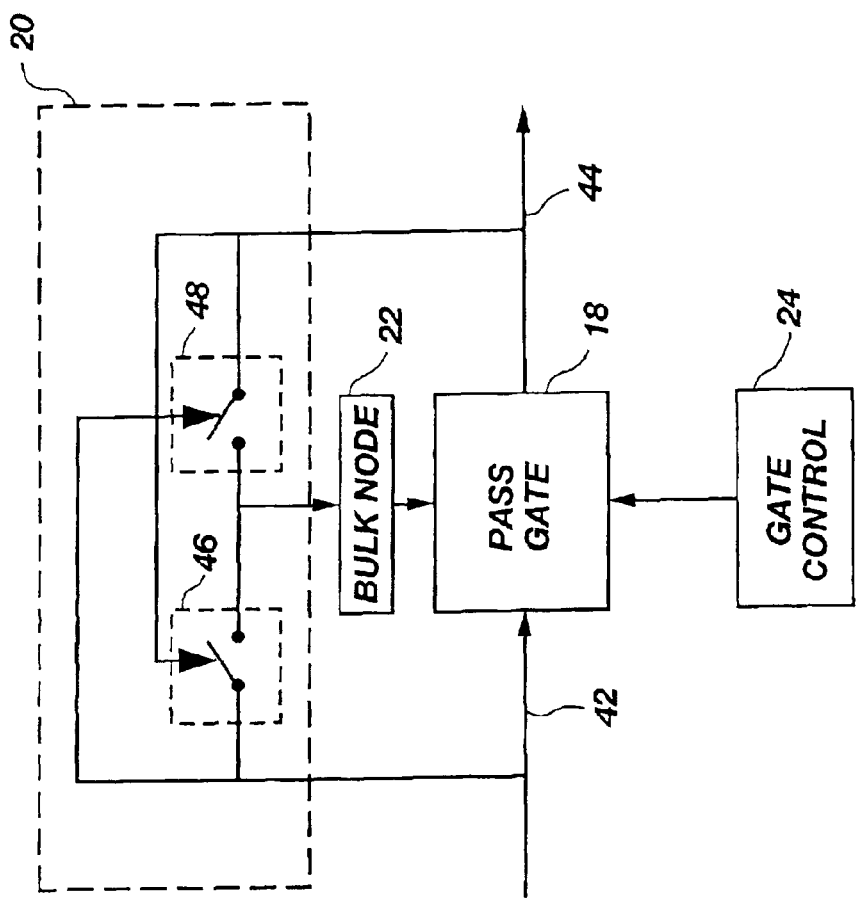
FIG. 3 illustrates biasing of a bulk node of a pass gate, in accordance with an embodiment of the present invention.

FIG. 3 illustrates the biasing configuration of pass gate 18, in accordance with an exemplary embodiment of the present invention. As described above, pass gate 18 embodied as, for example, a transistor needs to be properly biased at a bulk node 22 in order to prevent an undesirable latch-up condition at pass gate 18. Therefore, the present invention contemplates a bulk bias circuit 20 for providing the appropriate biasing of bulk node 22 to mitigate latch-up conditions. It should be recalled that the voltage potential at bulk node 22 be at a voltage potential that is the largest of either the input or output of pass gate 18. By way of example, pass gate 18 may be implemented as an MOS device having a source 42 and a drain 44. Such designation is merely illustrative and does not preclude a similar biasing structure for either the reversal of drain and source or the utilization of other transistor configurations having various other input and output designations including p-channel and n-channel MOS configurations.

From an operational point of view, bulk bias circuit 20 monitors and is responsive to the potential of both source 42 and drain 44 in making an evaluation of which voltage potential to couple to bulk node 22. FIG. 3 illustrates the operational coupling of the selected biasing voltage potential present at either source 42 or drain 44 and the respective coupling thereto with bulk node 22 through the activation of either of source switch 46 or drain switch 48. It should be pointed out that, while the present invention contemplates the higher voltage potential of either the source 42 or drain 44 being coupled with bulk node 22, it is also contemplated that at certain voltage potential transition regions, which will be described hereafter, neither of the switches 46 and 48 may be closed to allow the bulk node 22 to "float" at a then-existing bulk node potential.

Figure 4:
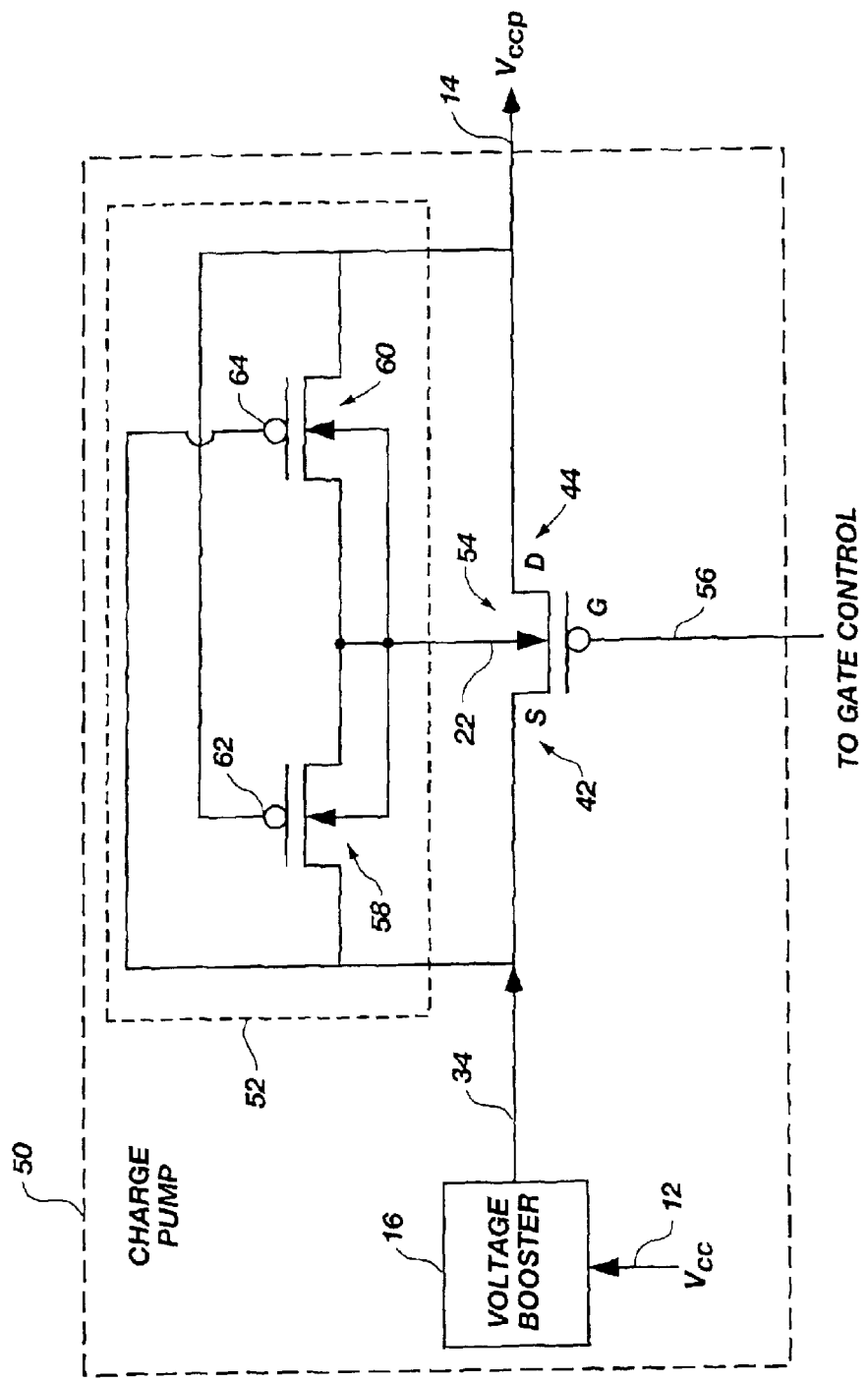
FIG. 4 illustrates biasing of a bulk node of a transistor in a charge pump application for mitigating latch-up, in accordance with a preferred embodiment of the present invention.

FIG. 4 illustrates a specific exemplary embodiment of a charge pump with the pass gate and biasing circuit implemented using a p-channel MOS configuration. Referring to FIG. 4, a charge pump 50 assumes a specific configuration from the generic charge pump 10 of FIG. 1. Charge pump 50 further includes a voltage booster 16 which may assume various configurations described above including the embodiment as illustrated in FIG. 2. Charge pump 50 further includes a bulk bias circuit 52 electrically coupled to a pass gate 54. Pass gate 54 is illustrated as a p-channel MOS transistor coupled to voltage booster 16 through which the switched voltage passes on boosted voltage output 34. Pass gate 54 further includes a bulk node 22, a source 42 and a drain 44 as well as a gate 56 which couples to gate control signal 24 (FIG. 1).

Bulk bias circuit 52 is comprised of a source switch transistor 58 coupled in series to a drain switch transistor 60. As illustrated, source switch transistor 58 is controlled at a gate 62 by the output voltage VCCP at output voltage node 14 also appearing upon drain 44. Similarly, drain switch transistor 60, at its gate 64, is controlled by the voltage potential appearing as boosted voltage at boosted voltage output 34 also appearing on source 42 of pass gate 54. Each of switch transistors 58, 60 is further coupled to the bulk node 22 of pass gate 54.

Figure 5:
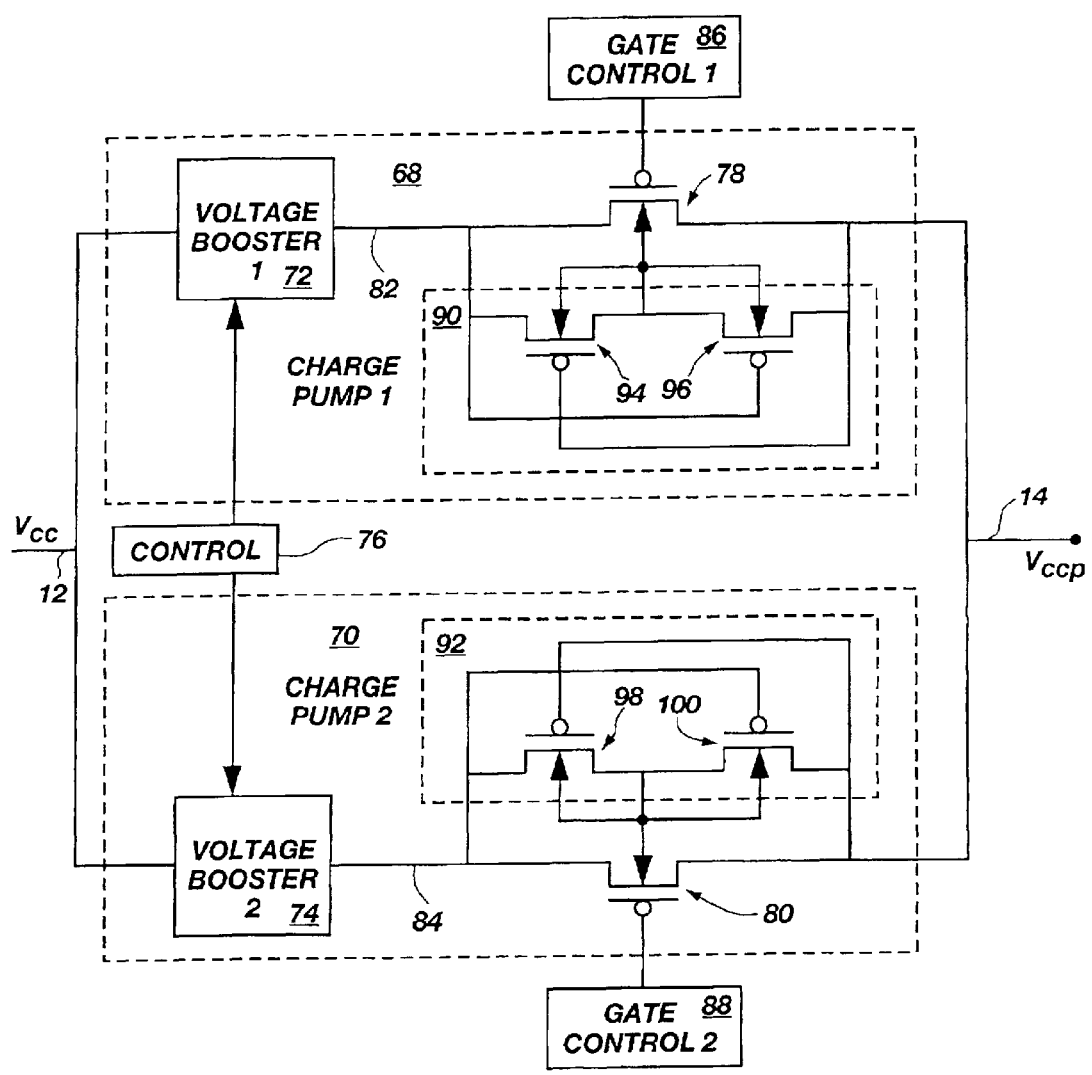
FIG. 5 illustrates a multiphase charge pump, in accordance with an embodiment of the present invention.

FIG. 5 illustrates a multiple charge pump arrangement incorporating the bulk biasing circuit, in accordance with an exemplary embodiment of the present invention. A multiphase charge pump 66 incorporates a plurality of charge pumps 68, 70 receiving input voltage VCC at input voltage node 12 and generating an output voltage VCCP at output voltage node 14. The present embodiment utilizes tandem charge pumps 68, 70 for providing additional charge generation for the load attached to output voltage node 14. Each of charge pumps 68, 70 further includes a voltage booster 72, 74, respectively, which operates under the control of control signal 76. Control signal 76 may be configured to provide phase alterations to voltage boosters 72, 74 or control signal 76 may control voltage boosters 72, 74 in unison with output voltage node 14, depending upon desired design considerations such as load demands and charge pumping capabilities.

Charge pumps 68, 70 further include biasing pass gates 78, 80, respectively, for isolating and transferring charge from boosted output voltage nodes 82, 84 to output voltage node 14. Switching of pass gates 78, 80 occurs under gate control 86, 88 in conjunction with control signal 76. Charge pumps 68, 70 further include bulk biasing circuits 90, 92, respectively, for providing biasing of the respective bulk nodes of pass gates 78, 80. Bulk biasing circuits 90, 92 are further comprised, in the present embodiment, of switches for coupling either the respective boosted voltage outputs or the output voltage VCCP to the respective bulk nodes. By way of example, the switches are comprised of transistors 94, 96, 98, 100.

Figure 6:
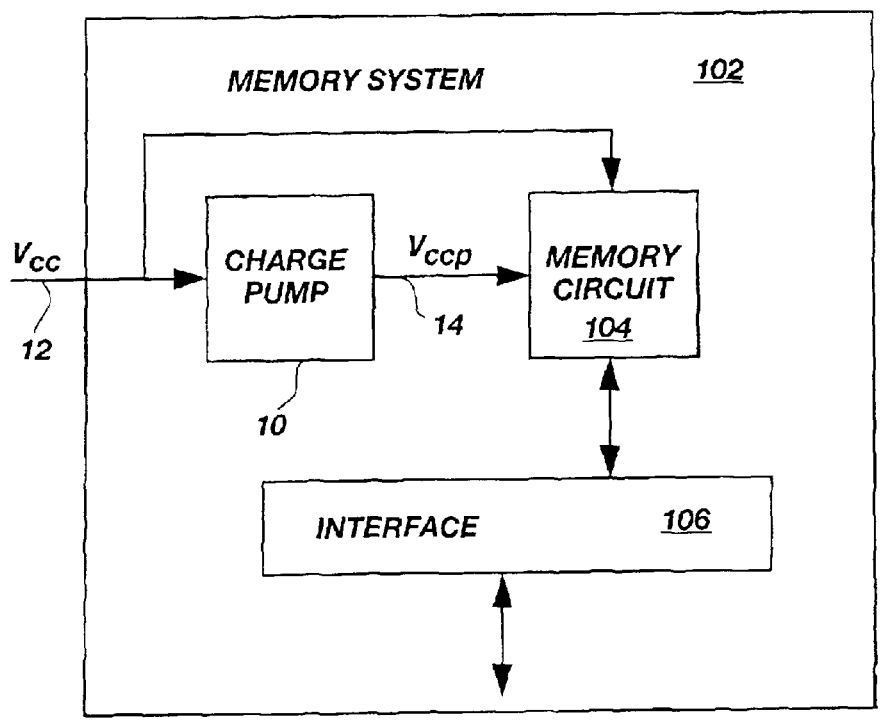
FIG. 6 is a block diagram of a memory system incorporating a charge pump according to the present invention.

While there are various systems wherein a charge pump finds application, FIG. 6 illustrates a memory system incorporating a charge pump in accordance with an embodiment of the present invention. A memory system 102 provides information storage for utilization in a computational environment and the storage elements or array is illustrated as memory circuit 104. Memory circuit 104 may assume various configurations including individual cells or arrays of cells as well as be comprised of various memory technologies such as RAM, DRAM, SRAM, FLASH, ROM, PROM, etc.

It is appreciated that the various memory circuits have individual programming and erasure specifications that utilize differing voltages and therefore find application for the present invention. Memory system 102 is further comprised of a charge pump 10 for providing an output voltage at output voltage node 14 that is of differing voltage potential than the input voltage present on input voltage node 12. Charge pump 10 is further comprised of the pass gate bulk node biasing circuit of the present invention for properly biasing the bulk node of the pass gate in order to mitigate latch-up conditions which are common in multivoltage applications.

Figure 7:
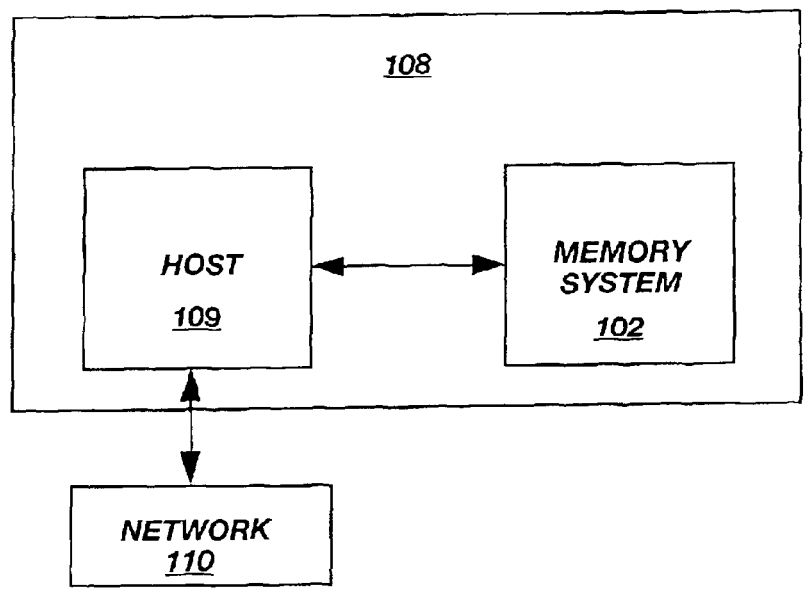
FIG. 7 illustrates a block diagram of a computer system incorporating a memory system, in accordance with an embodiment of the present invention.

Memory system 102 is further comprised of an interface 106 for providing exchange of data information between memory circuit 104 and a computational host or other interfacing device. The present invention is applicable to integrated circuits and may be implanted in a memory device with interface 106 providing circuitry for reading from and writing to the memory circuit 104. Memory system 102 may be further integrated into a computer system 108 as illustrated in FIG. 7. Memory system 102 is accessed by host 109 which reads and writes data into memory system 102. Computer system 108 may further interface with a network 110 for additional access and application.

Figure 8:
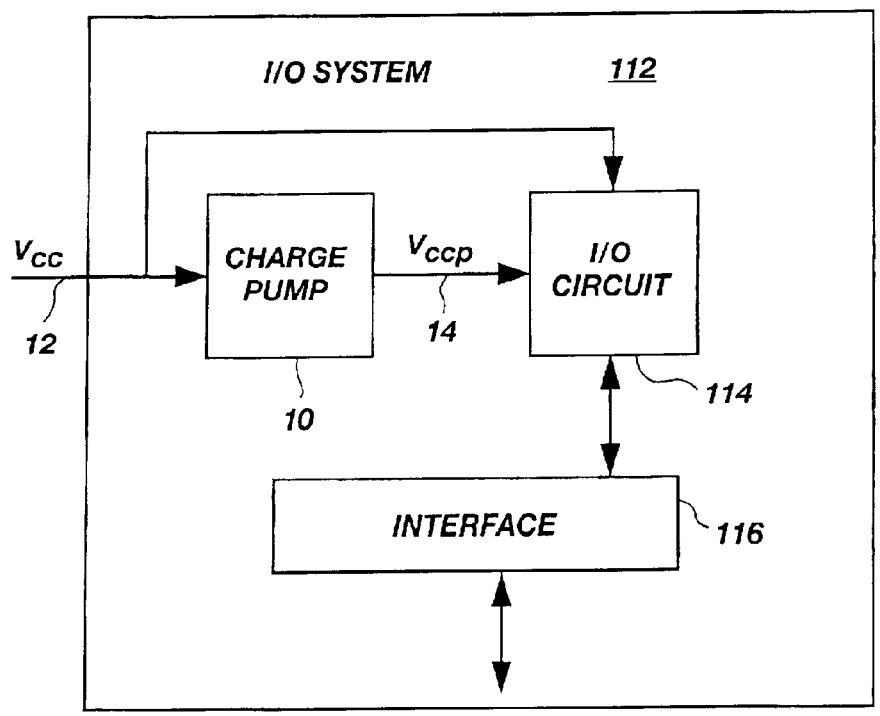
FIG. 8 illustrates an I/O system incorporating the charge pump of the present invention.
Figure 9:
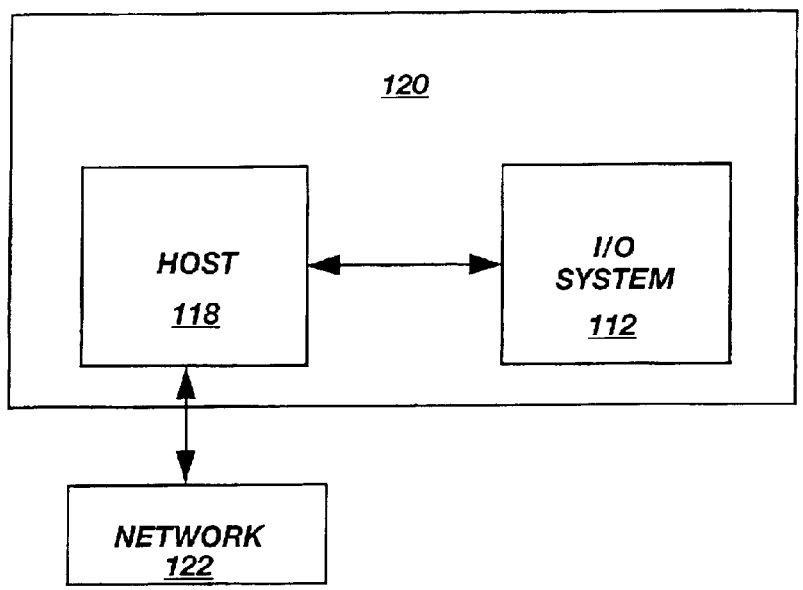
FIG. 9 illustrates a block diagram of a computer system incorporating an I/O system, in accordance with an embodiment of the present invention.

FIG. 8 illustrates a further system wherein the charge pump of the present invention finds application. Previous embodiments have illustrated the present invention's application to memory devices and related data storage; however, the present invention also finds application to other circuitry applications, defined generally herein as I/O system 112. While it is appreciated that performance of memory cells and associated arrays is improved through the use of differing voltages, such multivoltage aspects are contemplated within a broader I/O circuit 114 which is illustrated as receiving both input and output voltages from nodes 12, 14, respectively, and interfacing outside of I/O system 112 through an interface 116. FIG. 9 illustrates additional integration of I/O system 112 with a host 118 to form a computer system 120. Computer system 120 may further interface with a network 122 for additional connectivity and integration.

Figure 10:
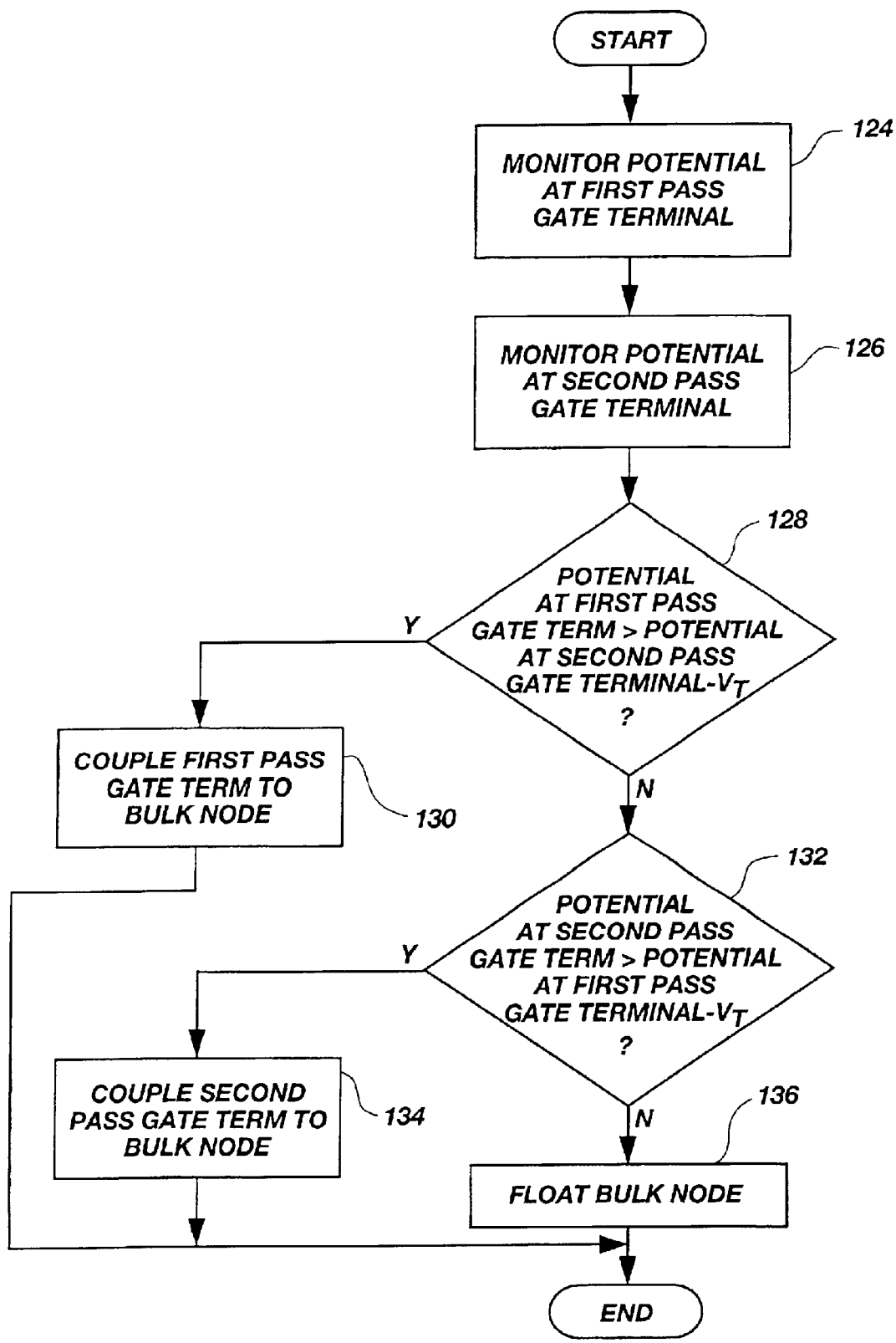
FIG. 10 is a flow chart illustrating biasing of a bulk node of a pass gate in a charge pump application, in accordance with the present invention.

FIG. 10 is a flow chart illustrating biasing of the bulk node of a pass gate in a charge pump application in accordance with the present invention. The method includes a step 124 for monitoring a first voltage potential at a first terminal of the pass gate and a step 126 for monitoring a second voltage potential at a second terminal of the pass gate. In one embodiment of the present invention, the pass gate is comprised of a PMOS transistor with the first terminal corresponding to one of either a source or drain terminal with the second terminal corresponding to the other terminal.

As described above, the bulk node needs to be referenced to the higher voltage potential present at either of those terminals. Therefore, a query step 128 determines if the voltage potential at the first pass gate terminal is greater than the voltage potential at the second pass gate terminal when adjusted for the threshold voltage of the transistor. When the condition is true, then processing passes to a step 130 wherein the voltage potential at the first pass gate terminal is coupled to the bulk node. Conversely, if the condition is not true, then processing passes to a query step 132 to determine if the voltage potential at the second pass gate terminal is greater than the voltage potential at the first pass gate terminal when adjusted for the threshold voltage of the transistor. When the condition is true, then processing passes to a step 134 wherein the voltage potential at the second pass gate terminal is coupled to the bulk node. Conversely, if the condition is not true, then processing passes to a step 136 wherein the bulk node is left unstrapped, in the present example, to either of the source or drain terminals of the pass gate. Such a condition is known by those of ordinary skill in the art as "floating" the terminal. In such a condition, the bulk node remains at its current potential until one of the source or drain terminals meets the differential voltage conditions described above. It should be pointed out that while query steps 128 and 132 are illustrated as consecutive steps, the actual circuitry described above is implemented as a concurrent evaluation of the then-present conditions. The method continuously repeats for the continuous monitoring of the present conditions.

A circuit, system and method have been described for the monitoring and detection of the available voltage potentials in and around a pass gate in a charge pumping embodiment for used by the pass gate for referencing the bulk node and minimizing latch-up conditions. Specific exemplary embodiments are illustrated as being MOS and, in particular, embodied as p-channel MOS devices. It should be apparent that such an invention also finds application in n-channel MOS device as well.

Although specific exemplary embodiments have been illustrated and described herein, it will be appreciate by those of ordinary skill in the art that any arrangement which is calculated to achieve the same purpose may be substituted for the specific embodiment disclosed. Thus, the present invention encompasses any modifications, adaptations and variations thereof. Therefore, it is intended that this invention be limited only by the claims and the equivalents thereof.

What is claimed is:

1. A charge pump for converting an input voltage to an output voltage of a different magnitude or polarity, comprising:
    a voltage booster for coupling to the input voltage for switching stored charge to a boosted voltage output, the voltage booster configured to generate a boosted voltage as a fluctuating voltage potential above and below the output voltage, the boosted voltage output having a boosted voltage thereon of a different magnitude or polarity from the input voltage;
    a pass gate for providing isolation and transfer between the boosted voltage and the output voltage, the pass gate coupled at an input terminal of the pass gate to the boosted voltage output of the voltage booster, the potential between the boosted voltage and the output voltage alternating during each of the switching of stored charge by the voltage booster, the pass gate further including an output terminal, a gate terminal, and a bulk node; and
    a biasing circuit for selecting a bulk node biasing voltage for the pass gate from among the boosted voltage and the output voltage, including:
        a first switch having a first switch terminal for coupling to the boosted voltage and a second switch terminal for coupling to the bulk node of the pass gate, the first switch further including a control terminal for coupling to the output voltage, the control terminal responsive to an applied voltage to enable conduction between the first switch terminal and the second switch terminal of the first switch; and
        a second switch having a first switch terminal for coupling to the bulk node of the pass gate and a second switch terminal for coupling to the output voltage, the second switch further including a control terminal for coupling to the boosted voltage, the control terminal responsive to an applied voltage to enable conduction between the first switch terminal and the second switch terminal of the second switch.

2. A charge pump, comprising:
    a voltage booster responsive to an input voltage for switching stored charge from the input voltage to a boosted voltage of a different magnitude or polarity from the input voltage, the voltage booster configured to generate the boosted voltage as a fluctuating voltage potential above and below the output voltage;
    a pass gate coupled at an input terminal to receive the boosted voltage of the voltage booster and to isolate and transfer the boosted voltage to an output terminal of the pass gate as an output voltage of the charge pump when switched in response to a pass gate control signal at a gate terminal of the pass gate; and
    a biasing circuit coupled to the boosted voltage and the output voltage of the charge pump for biasing a bulk node of the pass gate with a potential comprising the greater of a potential of the boosted voltage and a potential of the output voltage.

3. The charge pump, as recited in claim 2, wherein the charge pump includes an integrated circuit on a common substrate.

4. The charge pump, as recited in claim 3, wherein the integrated circuit includes a memory device.

5. The charge pump, as recited in claim 2, wherein the charge pump includes a metal-oxide semiconductor (MOS) integrated circuit.

6. The charge pump, as recited in claim 2, wherein the biasing circuit includes:
    a first switch having a first switch terminal for coupling to the input voltage and a second switch terminal for coupling to the bulk node of the pass gate, the first switch further including a control terminal for coupling to the output voltage, the control terminal responsive to an applied voltage to enable conduction between the first switch terminal and the second switch terminal of the first switch; and
    a second switch having a first switch terminal for coupling to the bulk node of the pass gate and a second switch terminal for coupling to the output voltage, the second switch further including a control terminal for coupling to the input voltage, the control terminal responsive to an applied voltage to enable conduction between the first switch terminal and the second switch terminal of the second switch.

7. A charge pump, comprising:
    a plurality of voltage boosters responsive to an input voltage for switching stored charge from the input voltage to an individual one of a respective plurality of boosted voltages of a different magnitude or polarity from the input voltage, at least one of the plurality of voltage boosters configured to generate one of the respective plurality of boosted voltages as a fluctuating voltage potential above and below a unified output voltage;

a corresponding plurality of pass gates, each respectively coupled to the plurality of voltage boosters to individually receive a respective one of the plurality of boosted voltages and to isolate and transfer the plurality of boosted voltages to an individual corresponding output terminal of the plurality of pass gates as the unified output voltage of the charge pump in response to at least one pass gate control signal coupled to an individually corresponding plurality of pass gate control terminals; and a corresponding plurality of biasing circuits, each individually coupled to the plurality of boosted voltages and the output voltage of the charge pump for biasing an individually respective plurality of bulk nodes of the plurality of pass gates with a greater potential of either the respective one of the plurality of boosted voltages or the output voltage.

8. An integrated memory device comprising:

an array of memory cells operative with a first voltage and a second voltage different in magnitude or polarity from the first voltage; and a charge pump coupled to at least a portion of the array of memory cells to generate the second voltage from the first voltage, the charge pump including:
  a voltage booster responsive to the first voltage for switching stored charge from the first voltage to a boosted voltage of a different magnitude or polarity from the first voltage, the voltage booster configured to generate the boosted voltage as a fluctuating voltage potential above and below the second voltage;
  a pass gate coupled at an input terminal to receive the boosted voltage of the voltage booster and to isolate and transfer the boosted voltage to an output terminal of the pass gate as a second voltage of the charge pump when switched in response to a pass gate control signal at a gate terminal of the pass gate; and
  a biasing circuit coupled to the boosted voltage and the second voltage of the charge pump for biasing a bulk node of the pass gate with the greater potential of either the boosted voltage or the second voltage.

9. The integrated memory device, as recited in claim 8, wherein the integrated memory device includes of metal-oxide semiconductor (MOS) composition.

10. The integrated memory device, as recited in claim 9, wherein the pass gate and said biasing circuit are comprised of p-channel transistors.

11. The integrated memory device, as recited in claim 8, wherein the biasing circuit is configured for selecting a bulk node biasing voltage for the pass gate from among said boosted voltage and said second voltage, said biasing circuit including:
  a first switch having a first switch terminal for coupling to the boosted voltage and a second switch terminal for coupling to the bulk node of the pass gate, the first switch further including a control terminal for coupling to the second voltage, the control terminal responsive to an applied voltage to enable conduction between the first switch terminal and the second switch terminal of the first switch; and
  a second switch having a first switch terminal for coupling to the bulk node of the pass gate and a second switch terminal for coupling to the second voltage, the second switch further including a control terminal for coupling to the boosted voltage, the control terminal responsive to an applied voltage to enable conduction between the first switch terminal and the second switch terminal of the second switch.

12. The integrated memory device, as recited in claim 11, so configured that when the boosted voltage and the second voltage are less than a threshold voltage of either of the first switch or the second switch, neither of the first switch nor the second switch enables conduction to allow the bulk node of the pass gate to float.

13. A computer system, comprising:
  a processor; and
  a memory system operably coupled to the processor including:
    an array of memory cells operative with a first voltage and a second voltage different in magnitude or polarity from the first voltage; and
    a charge pump coupled to at least a portion of the array of memory cells to generate the second voltage from the first voltage, the charge pump including a voltage booster responsive to the first voltage for switching stored charge from the first voltage to a boosted voltage of a different magnitude or polarity from the first voltage, the voltage booster configured to generate the boosted voltage as a fluctuating voltage potential above and below the second voltage and a biasing circuit for biasing a bulk node of a pass gate used to isolate and transfer charge from the first voltage to form the second voltage, the biasing circuit configured for biasing a bulk node of the pass gate with the greater of a potential at an input terminal and a potential at an output terminal of the pass gate.

14. The computer system, as recited in claim 13,
  wherein the pass gate is coupled at an input terminal to receive the boosted voltage of the voltage booster and to isolate and transfer the boosted voltage to an output terminal of the pass gate as the second voltage of the charge pump when switched in response to a pass gate control signal at a gate terminal of the pass gate; and
  wherein the biasing circuit is coupled to the boosted voltage and the second voltage of the charge pump for biasing the bulk node of the pass gate with the greater of a potential of the boosted voltage and a potential of the second voltage.

15. The computer system, as recited in claim 14, wherein the biasing circuit is configured for selecting a bulk node biasing voltage for the pass gate from among the boosted voltage and the second voltage, including:
  a first switch having a first switch terminal for coupling to the boosted voltage and a second switch terminal for coupling to the bulk node of the pass gate, the first switch further including a control terminal for coupling to the second voltage, the control terminal responsive to an applied voltage to enable conduction between the first switch terminal and the second switch terminal of the first switch; and
  a second switch having a first switch terminal for coupling to the bulk node of the pass gate and a second switch terminal for coupling to the second voltage, the second switch further including a control terminal for coupling to the switched voltage, the control terminal responsive to an applied voltage to enable conduction between the first switch terminal and the second switch terminal of the second switch.

16. An integrated circuit comprising:
  a circuit operative with a first voltage and a second voltage different in magnitude or polarity from the first voltage; and a charge pump coupled to at least a portion of the circuit to generate the second voltage from the first voltage, the charge pump including:
- a voltage booster responsive to the first voltage for switching stored charge from the first voltage to a boosted voltage of a different magnitude or polarity from the first voltage, the voltage booster configured to generate the boosted voltage as a fluctuating voltage potential above and below the second voltage;
- a pass gate coupled at an input terminal to receive the boosted voltage of the voltage booster and to isolate and transfer the boosted voltage to an output terminal of the pass gate as a second voltage of the charge pump when switched in response to a pass gate control signal at a gate terminal of the pass gate; and
- a biasing circuit coupled to the boosted voltage and the second voltage of the charge pump for biasing a bulk node of the pass gate with a greater of a potential of the boosted voltage and a potential of the second voltage.

17. An integrated circuit, comprising:
a first circuit portion operative on a first voltage;
a second circuit portion operative on a second voltage; and
a charge pump operably coupled to the first circuit portion and the second circuit portion, the charge pump configured for generating the second voltage from the first voltage, including:
- a voltage booster responsive to the first voltage for switching stored charge from the first voltage to a boosted voltage of a different magnitude or polarity from the first voltage, the voltage booster configured to generate the boosted voltage as a fluctuating voltage potential above and below the second voltage;
- a pass gate coupled at an input terminal to receive the boosted voltage of the voltage booster and to isolate and transfer the boosted voltage to an output terminal of the pass gate as a second voltage of the charge pump when switched in response to a pass gate control signal at a gate terminal of the pass gate; and
- a biasing circuit coupled to the boosted voltage and the second voltage of the charge pump for biasing a bulk node of the pass gate with a greater of a potential of the boosted voltage and a potential of the second voltage.

18. A method for converting an input voltage to an output voltage of different magnitude or polarity, the method comprising:
- generating a boosted voltage from the input voltage, the boosted voltage fluctuating in voltage potential above and below the output voltage;
- monitoring the boosted and output voltages at input and output terminals, respectively, of the isolating and transferring the boosted voltage to the output terminal using a pass gate;
- selecting one of the boosted and output voltages having a greater potential; and
- coupling the one of the boosted and output voltages having a greater potential to a bulk node of the pass gate of a charge pump.

19. The method as recited in claim 18, wherein selecting comprises:
- coupling a first switch having a first switch terminal to the boosted voltage, coupling a second switch terminal to the bulk node of the pass gate, and coupling a control terminal to the output voltage; and
- coupling a second switch having a first switch terminal to the bulk node of the pass gate, coupling a second switch terminal to the output voltage, and coupling a control terminal to the boosted voltage.

20. The method, as recited in claim 19, wherein coupling comprises:
- activating one of the first and second switches when the boosted and output voltages vary by more than a threshold voltage of one of the first and second switches.

21. The method, as recited in claim 20, wherein coupling further comprises:
- floating the bulk node when the boosted and output voltages differ by less than the threshold voltage.

* * * * *